United States Patent [19]

Fischer

[11] Patent Number: 4,853,758
[45] Date of Patent: Aug. 1, 1989

[54] LASER-BLOWN LINKS

[75] Inventor: Frederick H. Fischer, Lower Macungie Township, Lehight County, Pa.

[73] Assignee: American Telephone and Telegraph Company, AT&T Bell Laboratories, Murray Hill, N.J.

[21] Appl. No.: 84,531

[22] Filed: Aug. 12, 1987

[51] Int. Cl.$^4$ .................... H01L 27/02; H01L 23/48
[52] U.S. Cl. ........................................ 357/51; 357/71
[58] Field of Search .................................. 357/51, 71

[56] References Cited

U.S. PATENT DOCUMENTS

| 4,228,528 | 10/1980 | Cenker et al. | 365/200 |
| 4,455,194 | 6/1984 | Yabuet et al. | 357/41 |
| 4,503,315 | 3/1985 | Kamioka et al. | 357/751 |
| 4,547,830 | 10/1985 | Yamauchi | 361/104 |

FOREIGN PATENT DOCUMENTS

| 0089814 | 3/1983 | European Pat. Off. | |
| 52-28280 | 3/1977 | Japan | 357/71 |

OTHER PUBLICATIONS

IBM Technical Disclosure Bulletin, vol. 22, No. 5, Oct. 1979, pp. 1971–1972, New York, US; B. K. Aggarwal et al.; "Laser Cutting Metal Through Quartz", *Whole Article*.

Patent Abstracts of Japan, vol. 7, No. 103 (E-173) [1248], May 6, 1983; & JP-A-58 23 475 (Fujitsu K.K.), 12-02-1983, *Abstract; Figures*.

Patent Abstracts of Japan, vol. 8, No. 81 (E$^3$238) [1518], Apr. 13, 1984; & JP-A-59 957 (Fujitsu K.K.), 06-01-1984, *Abstract; Figures*.

Primary Examiner—J. Carroll
Attorney, Agent, or Firm—James J. Fox

[57] ABSTRACT

An improved technique for blowing conductive links with a laser provides for a wider range of acceptable laser energies. The link in an upper interconnect level is placed on a pedestal, typically formed by etching away a thin layer of the underlying dielectric on which the conductive link is formed. A link in a lower interconnect level thereby has the thickness of the dielectric overlying it reduced. This has been found to reduce the minimum laser energy required to cleanly blow the links in both levels and to reduce the effect of link orientation on the required laser energy.

9 Claims, 1 Drawing Sheet

LASER-BLOWN LINKS

BACKGROUND OF THE INVENTION

1. Field of the Invention

The present invention relates to an improved technique for blowing conductive links by the application of radiant energy thereto.

2. Description of the Prior Art

Fusible conductive links are commonly used in solid state device production, including, for example, integrated circuit (IC) production. One type of fusible link is normally conductive, and is rendered non-conductive (i.e., "blown") by one or more pulses of laser energy directed at the link. The laser energy melts and/or vaporizes the conductive link material, thereby removing it from the conductive path. The conductive material may be a metal, for example aluminum, or alternately may be doped polysilicon or a metal silicide. The links are typically formed by patterning a layer of the conductor that is formed on a dielectric layer, typically silicon dioxide or a glass. It is further known to utilize multiple conductive interconnect levels having links in each level. For example, in one conventional process, a first conductive layer of doped polysilicon is deposited on a layer of silicon dioxide overlying a silicon substrate. (For increased conductivity, a metal may optionally be reacted with the top portion of the polysilicon to produce a silicide surface layer in the so-called "polycide" structure.) The polysilicon layer is then patterned to form a first interconnect level, which includes portions of the pattern at various locations intended to serve as links. A glass layer is then deposited, and a second conductive layer of aluminum is deposited and patterned to form a second interconnect level. Portions of the aluminum pattern also serve as links. A laser is subsequently used to blow the desired links in either or both of the two conductor levels.

One well known application for blowing links is in the programming of redundant rows and columns for integrated circuit memory arrays; see, for example, U.S. Pat. No. 4,228,528 co-assigned with the present invention. Another use is for programming logic chips that initially have a large number of identical logic gates connected together. By blowing the links wherever it is desired to remove a "short" from the final circuit design, a large variety of logic circuits may be implemented with relatively fast turn-around time. Still other possible uses include programming wafer scale integrated circuits, wherein links are blown to configure the active elements of the circuit in a desired pattern, or to substitute good circuits for defective ones.

The reliability of blowing links affects the overall yield of good integrated circuits. The reliability of link blowing is especially important when the number of links to be blown on a given IC is large. Therefore, methods of improving the ease and reliability of blowing links are desirable.

SUMMARY OF THE INVENTION

I have invented a technique for obtaining conductive circuit links that are more reliably blown by radiant energy directed thereto, which may typically be laser energy. A dielectric layer is formed to include regions of reduced thickness over the links of a given interconnect level. In a typical embodiment, the links of a higher interconnect level are thereby placed on dielectric pedestals. The regions of reduced dielectric thickness are typically obtained by etching the dielectric layer in regions not protected by an overlying etch mask.

DETAILED DESCRIPTION

Figure 1:
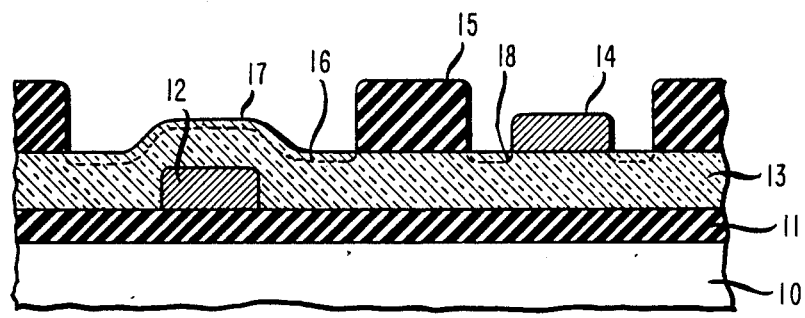
FIG. 1 shows a cross section of a two conductor level layout wherein the thickness of the interlevel dielectric is reduced over the first (bottom) conductor and the second (top) conductor level is located on a pedestal.

The following detailed description relates to improved fusible links, and a technique for forming them. In one embodiment, the present technique provides that a conductive link be placed on a raised portion of a dielectric layer, being referred to as a "pedestal" herein. One technique for forming the pedestal is also described herein, with others being possible. Referring to FIG. 1, an implementation of the present technique is illustrated with a two-level interconnect scheme, but the use of the present technique with any number of conductor levels is possible. A substrate 10 may be used for the formation of active components (not shown), which may include field effect transistors, bipolar transistors, optical devices, etc. In the exemplary case, the substrate is silicon, as is used in the complementary metal oxide semiconductor (CMOS) process for making n-channel and p-channel insulated gate field effect transistors. However, other semiconductor substrate types, including group III-V semiconductors, are possible, as is the use of non-semiconductor substrates.

An exemplary process sequence for forming a two-conductor level interconnect according to principles known in the art is as follows: A dielectric layer 11, typically silicon dioxide, is formed to overlie the substrate. Layer 11 may be deposited by a variety of techniques, or grown on the substrate. A first conductor level is deposited on the dielectric layer and lithographically patterned to form conductors 12. In the exemplary case, the first conductor level is a metal silicide, which may be formed by any of several known techniques. An interlevel dielectric layer 13 is then deposited so as to cover the conductors 12. The layer 13 is typically a phosphorus doped glass; for example, borophosphosilicate glass (BPSG). A second conductor level is then deposited and lithographically patterned to form the conductor 14, which is aluminum in the exemplary case.

In one implementation of the inventive technique, an etch-back step is then used to remove a top portion of the dielectric layer 13 in regions not protected by either the conductors 14 or an etch mask 15. The original surface 17 of the dielectric layer is removed to exposed etched surface 17. This places the conductor 14 on a pedestal 18 that is raised with respect to surface 16 of the dielectric layer 13 adjacent to the conductor 14. The height of the pedestal is typically at least 250 angstroms (25 nanometers) in order to provide the benefits of the present invention, and more typically at least 1000 angstroms (100 nanometers) in current designs. However, to maintain an adequate thickness of the dielectric layer 13, typically at least 50 percent of the original thickness of the dielectric layer is retained in the regions adjacent to the link conductor. Therefore, the pedestal height is typically less than the remaining thickness of the etched portion of the dielectric layer 13. In the exemplary case, the pedestal height is about 2000 angstroms (200 nanometers) when the thickness of the dielectric layer 13 prior to etching is about 6000 to 8000 angstroms (600 to 800 nanometers). For etching BPSG, a suitable etchant known in the art is a plasma comprising silicon hexafluoride and oxygen, with others being possible for practicing the present invention. Note also that in the exemplary case, the glass layer thickness overlying the conductors 12 is reduced by the etched thickness.

Figure 2:
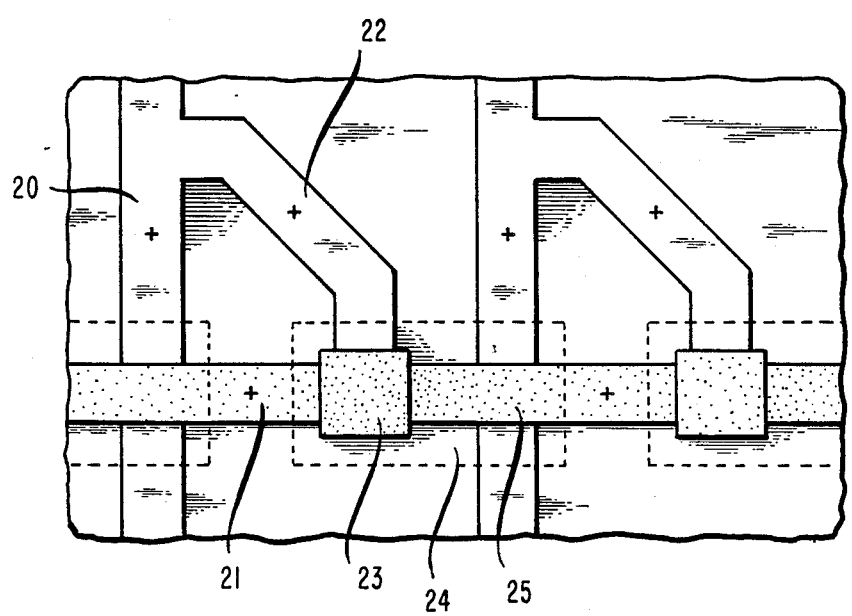
FIG. 2 shows a top view of a typical two conductor level layout, wherein a patterned masking layer is shown for providing etch resistance to selected areas.

Referring to FIG. 2, a top view is shown of an illustrative two-level interconnect technique. The first level (silicide) conductor 20 is shown running vertically, and the second level (metal) conductor 21 is shown running horizontally. An interconnect means is formed by a diagonal portion of the first level conductor 22 and a contact window 23 which connects the two levels. In this view, the link target (i.e., location to which the laser beam is directed) is marked by a "+" for each conductor. This illustrative layout allows for initially interconnecting logic elements throughout an array, and selectively disconnecting the interconnects by blowing the links to form a wide range of logic circuits. However, numerous other uses of links are possible, including various memory array redundancy schemes known in the art. Also shown is masking region 24, typically silicon nitride, which serves to prevent debris from the laser link blowing operation from electrically shorting the bottom interconnect level to the top level in the region 25 where they cross. Otherwise, an undesired connection could occur between a first level conductor (20) and a second level conductor (21) even after the link 22 was blown. The masking region 24 also protects the contact window 23 from the etching process, which could undesirably remove conducting material in the window and destroy a desired connection. Note that the presence of the masking layer also prevents the subsequent etch-back step from forming pedestals under the portion of metal conductor 21 that is underneath the masking layer 24. However, since the link portion of conductor 21 is placed outside the masking layer, the pedestal is allowed to form in the desired location.

The use of the pedestals has been found to aid the blowing of the links placed thereon. In particular, the minimum laser energy required to blow the links residing on the pedestals (i.e., the links in the top interconnect level in the present example) has been found to be reduced, thereby providing a larger processing "window" for the laser link blowing operation. For example, it has been found that for a conventional conductor configuration without the pedestals, as in the prior art, a minimum laser energy of from 1.25 to 1.45 microjoules was required to reliably blow the aluminum links. This was for a neodymium YAG laser operating at 1064 nanometers wavelength and a $1/e^2$ spot diameter of 5 micrometers. By contrast, using the inventive pedestals as described above for FIG. 1, a minimum laser energy of about 1.2 microjoules was required to reliably blow the aluminum links 14. In each case, the maximum allowable laser energy for blowing the aluminum links was 1.45 microjoules, above which damage to the underlying dielectric layer and/or the substrate occurred. Hence, the process window was increased about 20 percent, allowing for increased reliability of link blowing while avoiding damage to the underlying regions. It is postulated that the reduction in minimum laser energy is due to a reduction in lateral heat transfer when the conductor is raised on the pedestal. This is because the ambient atmosphere (typically air) laterally surrounding the pedestal has a lower thermal conductivity than typical dielectric materials (e.g., silica glasses, oxides, nitrides, etc.). Therefore, the laser need not supply as much energy to raise a link of a given thickness and width to a temperature sufficient to melt and/or vaporize the link. Furthermore, it appears that the region surrounding the blown portion of the conductor is relatively cleaner when placed on a pedestal. Hence, it is further postulated that the pedestal allows the surface tension of the melted metal of the conductor to pull back the melted region more completely toward the unmelted ends (i.e., away from the link target) during the link blowing operation. However, other explanations of the observed energy reduction and improved clearing of link material are possible.

In addition to improving the ability to blow the link raised on the pedestal, it has been found that the etching step used to form the pedestal aids in blowing links in the lower conductor level (12). In particular, silicide links having a dielectric glass layer of 6000 angstroms (600 nanometers) thickness after an etching step were blown more cleanly than for comparable links having a glass layer of 8000 angstroms (800 nanometers) thereon. It is postulated that this improvement in burn quality is largely due to the fact that a reduced thickness of the overlying dielectric 13 allows the silicide conductor to more easily rupture the dielectric laser as it blows, and therefore vaporize at a slightly lower energy level. In addition, the absorption of the laser light by the dielectric layer is reduced for a improvement is obtained while still retaining a relatively thicker glass layer (e.g., 8000 angstroms) over the major portion of the lower conductor level. This is very desirable to minimize the capacitance between the upper and lower conductor levels, which typically determines the minimum thickness of the glass layer that is acceptable in the crossover region 25, which is protected from etching by the masking region 24. In addition, the thicker glass over the major portion of the lower conductor level allows a desired degree of surface planarization, as due to a high-temperature glass flow operation, and improved protection of the regions thereunder.

Note that the improvement in blowing a link underneath etched portions of dielectric layer 13 is independent of whether a pedestal is formed for the link conductor overlying the dielectric layer. Therefore, the present technique may be used to improve link blowing in an underlying interconnect level even if no links are present in the upper interconnect level. In that case, the making layer 24 may cover all of the upper interconnect level, with openings for the lower links only. A typical masking layer 24 is formed of silicon nitride (or silicon dioxide) according to procedures known in the art for forming so-called "SiN caps", with the openings provided as indicated above. This desirably allows the integrated circuit to be pre-packaged before the link blowing operation, if desired. It has been found the the use of a subsequent clean-up etch to remove conductive debris left after the link-blowing operation is then not needed in many cases, but may be performed if desired, with the masking layer then serving to protect the major portion of the integrated circuit from the clean-up etchant. The masking layer 24 may alternately be a lithographic resist material having openings for obtaining the desired etched regions, with the resist then typically being removed prior to the deposition of a cap layer and packaging.

It is apparent that still other link conductor types, for example gold links used in gallium arsenide integrated circuits, can benefit from being placed on a pedestal. It is also known to mount several integrated circuits on a common substrate, often referred to as a "chip carrier", which may be formed of silicone or various ceramic materials. The interconnects between the integrated circuits may then include links formed by the inventive technique. Circuitry used with other solid state device types, for example opto-electric devices, magnetic devices, and superconducting devices, formed on a variety of substrate materials, can also benefit from links formed according to the inventive technique. In addition, while one convenient technique for forming the pedestal has been shown, other techniques are possible. For example, a dual-layer dielectric comprising two different materials allows etch selectivity, so that a convenient etch stop can be used to define the height of the pedestal. The pedestal is then formed of a first dielectric material located on a second dielectric material. The pedestal may also be used on more than one conductor level, as required to obtain the desired linkblowing process windows. Furthermore, while a laser is the presently preferred source of the link-blowing energy, other sources of radiant energy are possible. For example, non-coherent electromagnetic radiation, electron beam, or ion beam radiation may be used to blow the link depending on the link material and application.

What is claimed is:

1. A solid state circuit comprising a lower interconnect level having a conductive link adapted to being rendered non-conductive by the application of radiant energy thereto, wherein said interconnect level is overlaid by a dielectric layer that is overlaid by an upper interconnect level which crosses over said lower interconnect level at crossover locations, CHARACTERIZED in that an etch-resistant masking layer is formed over at least said crossover locations, and the thickness of said dielectric layer over said link in the lower interconnect level is substantially less than the thickness of said dielectric layer under said etch-resistant masking layer.

2. The circuit of claim 1 wherein the thickness of said dielectric layer over said link is at least 25 nanometers less than the thickness of said dielectric layer under said masking layer.

3. The circuit of claim 1 wherein said link is a metal.

4. The circuit of claim 3 wherein said link is aluminum.

5. The circuit of claim 3 wherein said link is gold.

6. The circuit of claim 1 wherein said link comprises a metal silicide.

7. The circuit of claim 6 wherein said silicide is titanium silicide.

8. The circuit of claim 1 wherein said link comprises doped polysilicon.

9. The circuit of claim 1 wherein said dielectric layer is a glass comprising phosphorus.

* * * * *